United States Patent [19]

Terui

[11] Patent Number: 4,955,062
[45] Date of Patent: Sep. 4, 1990

[54] PATTERN DETECTING METHOD AND APPARATUS

[75] Inventor: Hiroshi Terui, Kawasaki, Japan

[73] Assignee: Canon Kabushiki Kaisha, Tokyo, Japan

[21] Appl. No.: 382,037

[22] Filed: Jul. 18, 1989

Related U.S. Application Data

[63] Continuation of Ser. No. 130,449, Dec. 9, 1987, abandoned.

[30] Foreign Application Priority Data

Dec. 10, 1986 [JP] Japan .............................. 61-294362
Dec. 10, 1986 [JP] Japan .............................. 61-294363

[51] Int. Cl.$^5$ ........................ G06K 9/03; G06K 9/20
[52] U.S. Cl. ........................................ 382/8; 382/48
[58] Field of Search ................................. 382/8, 48

[56] References Cited

U.S. PATENT DOCUMENTS

| | | | |
|---|---|---|---|
| 4,115,762 | 9/1978 | Akiyama et al. | 382/8 |
| 4,499,597 | 2/1985 | Alves | 382/48 |
| 4,566,125 | 1/1986 | Clunn | 382/48 |
| 4,570,181 | 2/1986 | Yamamura | 382/48 |
| 4,745,296 | 5/1988 | Driller et al. | 382/8 |

Primary Examiner—Thomas H. Tarcza
Assistant Examiner—Ian J. Lobo
Attorney, Agent, or Firm—Fitzpatrick, Cella, Harper & Scinto

[57] ABSTRACT

A pattern detecting method for accurately detecting the position of a center of an image of a pattern is disclosed. The method includes the steps of forming an image of a pattern on an image pickup device, dividing the image of the pattern into plural portions and detecting the center of the image of the pattern in each portion, and determining the position of the center of the image of the pattern, on the basis of the data obtained by the detection made with regard to each portion.

2 Claims, 6 Drawing Sheets

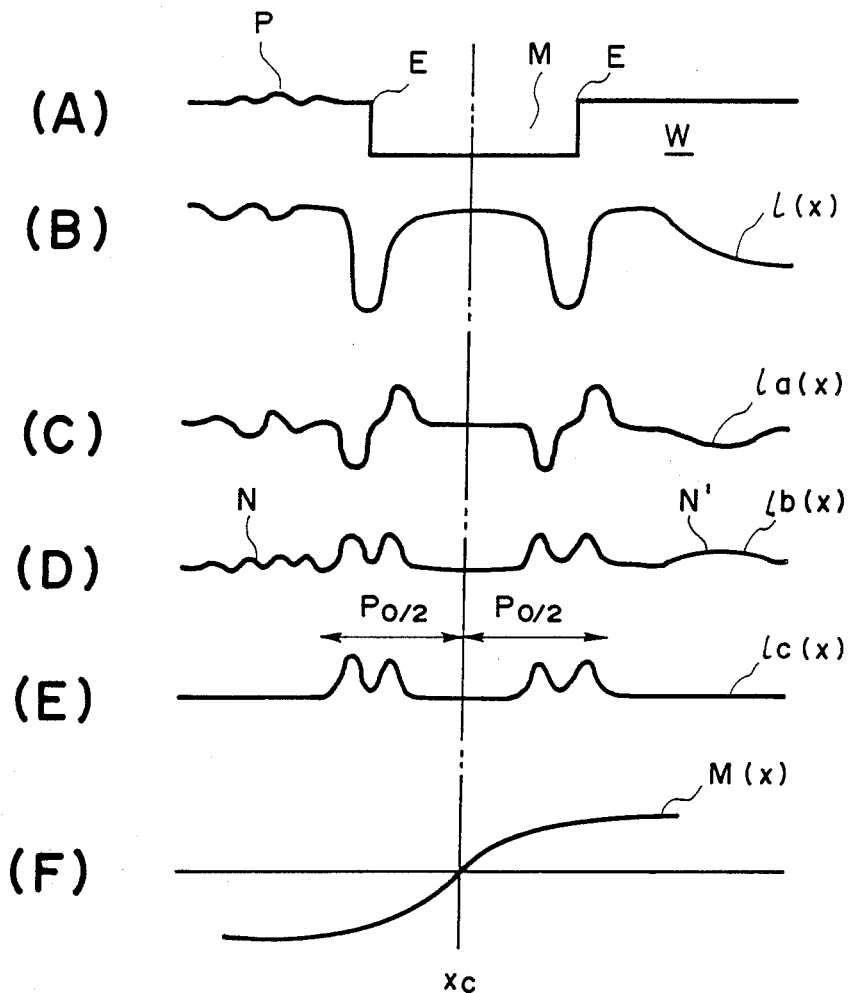
F I G. 2

PATTERN DETECTING METHOD AND APPARATUS

This application is a continuation of application Ser. No. 07/130,449 filed Dec. 9, 1987, now abandoned.

FIELD OF THE INVENTION AND RELATED ART

This invention relates to a pattern detecting method and apparatus and, more particularly, a pattern detecting method and an apparatus for carrying out the method, for detecting a pattern used, e.g., for an alignment purpose in an exposure apparatus such as a mask aligner or a stepper for use in the manufacture of semiconductor devices or otherwise.

In such semiconductor device manufacturing exposure apparatus such as mask aligners or steppers, it is necessary to align a wafer with respect to a predetermined reference position. For this purpose, a mark pattern (usually called "an alignment mark") provided on the wafer is photoelectrically detected and, from a signal (e.g. a video signal) obtained as a result of such photoelectric detection, the center of the mark pattern is detected. On the basis of the thus detected center of the mark pattern, the wafer is aligned with respect to the predetermined reference position. For the detection of the center of the mark pattern, the video signal is binarized with a suitable slice level, and the center of the thus binarized signal is determined as the center of the mark pattern.

Since a wafer is usually coated with a photoresist material, there easily occur a number of interference fringes if the wafer is illuminated by a monochromatic light. If this occurs, it is possible that the intensity of the obtained video signal is too low as compared with the slice level. Also, it is possible that the obtained video signal has insufficient symmetry. In such a case, it is difficult to accurately detect the center of the mark pattern, with the above-described detecting method wherein the mark center is determined from the center of a binarized video signal. A similar problem occurs in a case where a video signal having an intensity level near the slice level contains a substantial noise component or in a case where a video signal is asymmetric due to any defect of the mark pattern itself, or unevenness exists in the illuminance or for any other reason.

In an attempt to obviate such a problem peculiar to the above-described mark pattern detecting method, U.S. Pat. No. 4,115,762 proposes a mark pattern detecting method. According to this method, the symmetry of the waveform of a video signal is examined and a point in the signal waveform with respect to which the signal waveform shows the best symmetry is determined as the center of the mark pattern.

Practically, however, video signals actually obtainable from mark patterns are different from each other, for different wafers or for different portions of a single wafer (i.e. for different shot areas on a wafer in the case of the mask aligner or the stepper), due to any unevenness in the resist coating, optical shading or the material of each wafer or for any other reason. Thus, practically it is not easy to obtain clear and sharp video signals which can be directly used, in their original states, for the determination of the center of the mark pattern.

Further, when an alignment mark pattern extending linearly in a certain direction is going to be scanned in a direction perpendicular to the lengthwise direction of the pattern, a video signal obtained will have significantly different signal contrasts corresponding to different portions of the mark pattern along the lengthwise direction of the pattern. Additionally, in the obtained video signal, the different portions of the mark pattern along the lengthwise direction thereof will have significantly different widths. Such differences result from the unevenness of the resist coating or otherwise. As a consequence, the center of the mark pattern determined on the basis of the video signal changes with the location of the scan line set for the mark pattern for the detection of the video signal.

SUMMARY OF THE INVENTION

It is accordingly a primary object of the present invention to provide a pattern detecting method and apparatus by which the center of a mark pattern can be detected very accurately.

It is another object of the present invention to provide a pattern detecting method and apparatus suitably usable in a mask aligner or a stepper for detecting an alignment mark pattern provided for aligning a mask (reticle) and/or a wafer.

It is a further object of the present invention to provide a pattern detecting method and apparatus by which adverse effects of variation, distortion or otherwise of video image signals upon detection of a linear mark pattern can be minimized, with the result that the center of the linear mark pattern can be detected at a high precision.

In accordance with one aspect of the present invention, to achieve these objects, there is provided a pattern detecting method which comprises the steps of: forming on an image pickup device an image of a pattern provided on an object; transforming the image formed on the image pickup device into a video signal; setting a plurality of windows with regard to the video signal so as to divide the image of the pattern into plural portions such that the divided portions are processed independently of each other; detecting, in each window, the position of the center of a corresponding portion of the image of the pattern; and calculating the position of the center of the pattern, on the basis of the detection of the center with respect to the set windows.

In accordance with another aspect of the present invention, there is provided a pattern detecting apparatus which comprises: image pickup means for observing a pattern provided on an object, the image pickup means having an image pickup device on which an image of the pattern is formed; detecting means operable to set a plurality of windows with regard to a video signal produced from the image pickup device so as to divide the image of the pattern formed on the image pickup device into plural portions such that the divided portions of the image are processed independently of each other, the detecting means further being operable to detect, in each window, the position of the center of a corresponding portion of the image of the pattern; and calculating means for calculating the position of the center of the pattern, on the basis of the detection of the center having been made in the windows.

The pattern detecting method and apparatus of the present invention is effectively usable in an exposure apparatus such as a mask aligner or a stepper, for detecting an alignment mark at the time of alignment of a wafer and/or a mask (reticle).

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 2 is a waveform view showing various signal waveforms corresponding to the wafer mark pattern, having a sectional shape shown in a part (A) of FIG. 2, and obtainable at different portions of the pattern detecting apparatus of the FIG. 1 embodiment.

DESCRIPTION OF THE PREFERRED EMBODIMENTS

Figure 1:
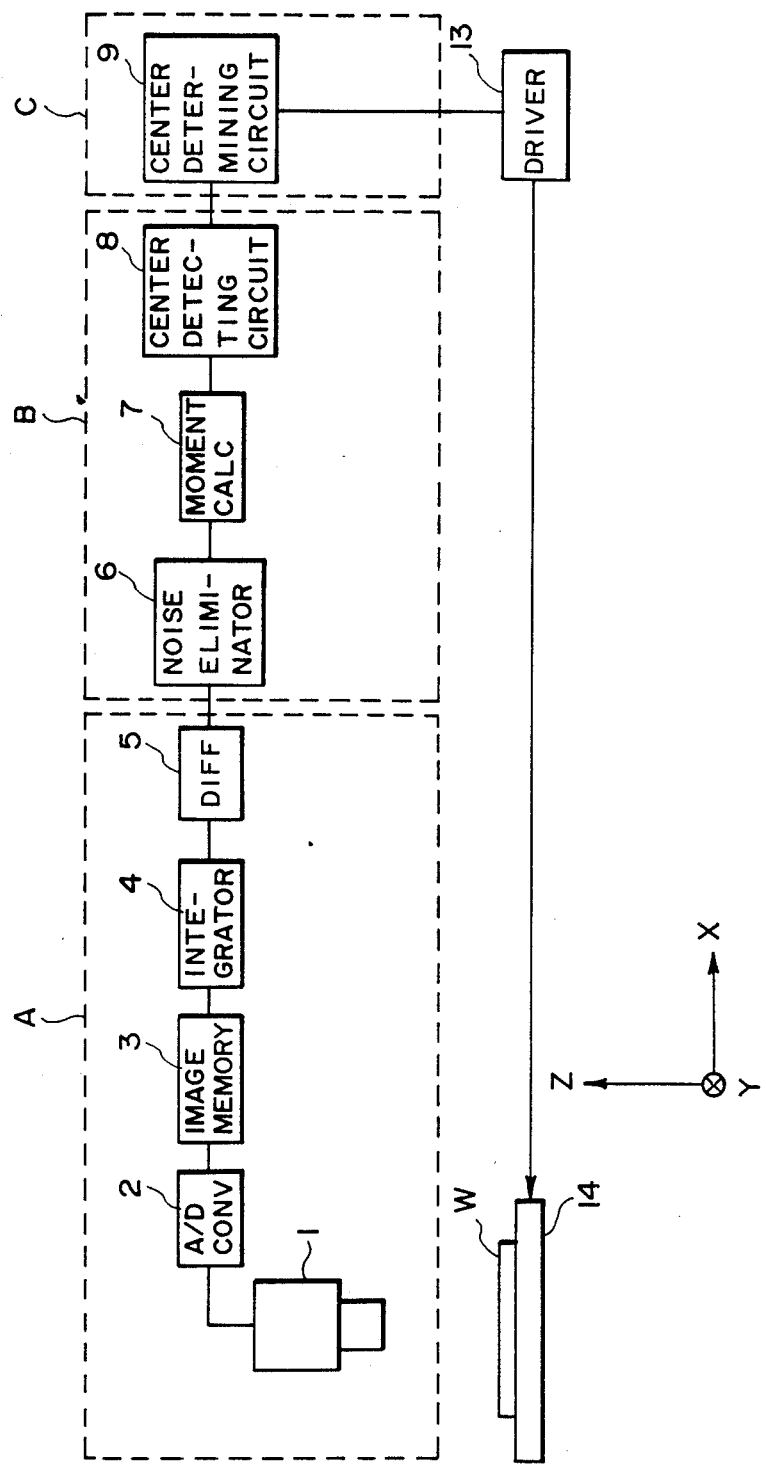
FIG. 1 is a schematic and diagrammatic view of a pattern detecting apparatus according to one embodiment of the present invention, which is arranged to detect a mark pattern provided on a wafer.

Referring first to FIG. 1, there is shown in a diagrammatic view a pattern detecting apparatus according to one embodiment of the present invention. In this embodiment, the pattern detecting apparatus is incorporated into a semiconductor device manufacturing exposure apparatus, for detecting a mark pattern provided on a semiconductor wafer.

Figure 3:
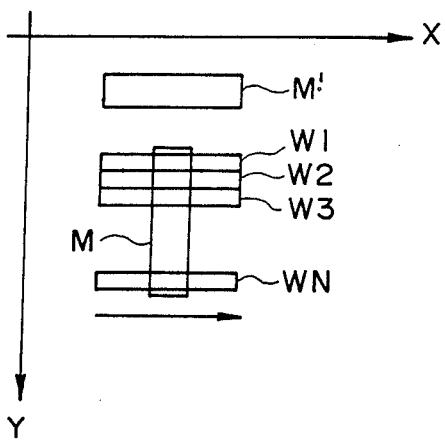
FIG. 3 is a schematic view showing the relation between a light image of the mark pattern and windows set therefor.

The semiconductor wafer denoted at W has formed on its surface a mark pattern M which is defined by a recess such as illustrated in a part (A) of FIG. 2. Usually, the surface of the wafer W is coated with a photoresist material. An image pickup device 1 comprises an ITV camera, an area image sensor (e.g. a number of solid-state image pickup elements such as charge coupled devices which are arrayed two-dimensionally) or otherwise. As shown in FIG. 3, the image pickup device 1 is adapted to observe (by video-taking) a predetermined range of the wafer W which range contains the mark pattern M. A light image formed on an image pickup surface of the image pickup device is scanned along a scan line extending in a direction denoted by an arrow in FIG. 3 (i.e. in the X direction), whereby data concerning each picture element on said scan line is output from the image pickup device as a video signal. After such X-direction scan is completed, the video image is scanned along the next scan line extending in the X direction and spaced from the first scan line in the Y direction (which is called "secondary scan direction"). The X-direction scan is repeated by predetermined times along a predetermined number of scan lines, such that trains of video signals corresponding to the set scan lines are output in sequence from the image pickup device. Each signal train corresponds to one scan line.

In FIG. 3, there are shown two mark patterns M and M' extending in parallel to the Y direction and the X direction, respectively. These mark patterns M and M' are provided on the wafer W for allowing alignment of the same with respect to the X and Y directions as viewed in FIG. 1. Since the principle of pattern detection is essentially the same for the two mark patterns M and M', description will be made only to the manner of detection of the center of the mark pattern M, with respect to the X direction, whose lengthwise direction coincides with the Y direction. Denoted $W_1$, $W_2$, . . . and $W_N$ are windows which are set with regard to a light image of the mark pattern M and which are arrayed in the Y direction. The length and the width of each window in the X and Y directions as well as the number of the windows $W_1$-$W_N$ may be determined as desired. However, if the size of each window in the X direction is too large, it requires a long time for the signal processing. Therefore, it is preferable that, with respect to the X direction, each window has a size which is small but which is sufficient to cover the light image of the mark pattern M in the X direction (i.e. sufficient to assure photoelectric conversion of the light image). Also, with regard to the Y direction, preferably each window may have a size which is sufficiently large to preclude adverse effects of distortion of the light image of the mark pattern, resulting from unevenness of the photoresist coating on the wafer W surface. Further, the number of the windows Wi (i=1 to N) may preferably be determined so as to assure that, when numerical values concerning the center of the mark pattern and obtained with regard to the windows Wi are processed statistically at a later stage so as to determine the center of the mark pattern M, such statistical processing is effective for the determination.

Referring back to FIG. 1, the video signals from the image pickup device 1 are supplied to an analog-to-digital converter 2 which is adapted to sample each video signal train at a predetermined periodicity corresponding to the picture elements on one scan line, such that each video signal in one train which is in the form of analog data is converted into a signal in the form of digital data. An image memory 3 is adapted to store therein each digitalized video signal (picture image data) from the analog-to-digital converter 2, in accordance with an X-Y address of each picture element of the image pickup device 1. An integrator 4 is provided to integrate, with respect to each window, the picture image data stored in the image memory 3 with respect to the Y direction. Where the image data stored in the memory 3 is denoted by P(x, y), the range of a window Wi in the X direction is denoted by $x_1 \leq X \leq x_2$ and the range of the window Wi in the Y direction is denoted by $y_1 \leq y \leq y_2$, then the integrated data L(x) in the window Wi within the limitation of the range "$x_1 \leq X \leq x_2$" is determined by the following equation:

$$L(x) = \sum_{y=y_1}^{y_2} P(x,y) \quad (1)$$

The integrated data L(x) within the range $x_1 \leq X \leq x_2$ is illustrated in a part (B) of FIG 2. In the integrated data L(x) of this example, as seen from the illustration, the right-hand end portion is lowered in level due to any unevenness in the illuminance of for any other reason. Further, there remain noises (which are not so great) at a left-hand end portion due to the surface irregularity of the wafer W as denoted by a character P in the part (A) of FIG. 2. However, the other noise components such as random noises, spike noises or otherwise contained in the image data are attenuated as a result of the integration of the image data. Since the integration within the window Wi is effected in a comparatively narrow range "$y_1 \leq y \leq y_2$", there is substantially no effect of the distortion of the light image of the mark pattern M, upon the integration data L(x).

A difference calculator 5 is provided to calculate the differential with regard to the integration data L(x) supplied from the integrator 4. The calculator 5 is adapted to produce absolute data Lb(x) concerning differential data La(x). The data La(x) and Lb(x) can be expressed, by using k as a constant, as follows:

$$La(x) = \{L(x + k) - L(x - k)\} \quad (2)$$

$$Lb(x) = |La(x)| \quad (3)$$

The constant k is usually "1". When there is illuminance unevenness in the image pickup field, as a whole, of the image pickup device 1 and if there is a large waviness in the integrated data L(x) as a whole, adverse effects of such waviness are satisfactorily avoided by the above described processing arrangement. A signal pre-processing system denoted by a character A in FIG. 1 comprises the above-described components.

A noise eliminator 6 is operable to eliminate, from the differential data Lb(x) and by use of a suitable threshold Th, noise components such as a noise signal N corresponding to the surface irregularity P of the wafer W, a noise signal N' resulting from the illuminance unevenness and otherwise. The noise eliminator 6 functions to determine the threshold Th in accordance with the well-known "P-tyle method" and produces a signal Lc(x) which is obtained by eliminating the noise signals N and N' from the data Lb(x), as will be seen from the parts (D) and (E) of FIG. 2. Here, the data Lc(x) can be expressed as follows:

$$Lc(x) = Lb(x), \text{ if } Lb(x) \geq Th; \text{ or} \quad (4)$$
$$= 0, \text{ if } Lb(x) < Th$$

Figure 4A:
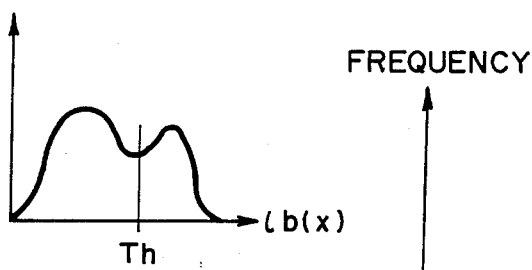
FIGS. 4A and 4B are graphs exemplifying a frequency distribution and cumulative frequency distribution, respectively, with regard to a signal Lb(x) for the determination of a threshold Th.
Figure 4B:
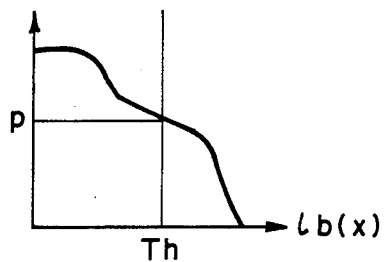

The principle of "P-tyle method" is fully discussed in "Image Recognition Theory", Binarization and Threshold Processing, by Makoto NAGAO. The threshold Th is determined according to this method. Namely, from the distribution of the frequency $H_1$ concerning the data Lb(x) such as illustrated in FIG. 4A, the distribution of the cumulative frequency $H_2$ concerning the data Lb(x) such as illustrated in FIG. 4B is determined. For this determination, the numerical values concerning the frequency $H_1$ in FIG. 4A are accumulated in a sequence according to the magnitude of the data Lb(x). Then, such value of the data Lb(x) that corresponds to a cumulative frequency $H_2$ which is "P" in the distribution of FIG. 4B, is determined as the threshold Th. Here, the character "P" denotes the number of effective edge signals which are predicted as being included in the data Lb(x). As shown in the part (E) of FIG. 2, the obtained signal Lc(x) is sufficiently clear and stable as compared with the signal L(x) shown in the part (B) of FIG. 2.

A moment calculator 7 is provided to calculate, with respect to each point in the X direction (hereinafter "x-point") on the signal Lc(x), the moment M(x) within the width Po of the signal Lc(x) supplied from the noise eliminator 6. The width Po is suitably set so that, when a selected x-point is coincident with the center Xc of the mark pattern M, the width Po has a range sufficient to cover the whole of the peak data (interference fringes of the light image of the mark pattern M) in the signal Lc(x). Also, the width Po is actually set in the form of two halves. Namely, two ranges each being denoted by "Po/2" are set in a symmetrical manner with regard to the selected x-point. The moment M(x) with regard to each x-point can be expressed by the following equation:

$$M(x) = \sum_{i=1}^{Po} Lc(x - i) \times i - \sum_{i=1}^{Po} Lc(x + i) \times i \quad (5)$$

The moment M(x) is output as a signal which represents substantially "zero" in a case where the selected x-point which is the subject of calculation is coincident with the center Xc of the mark pattern M, such as illustrated in part (F) of FIG. 2; a signal which represents "negative" if the selected x-point is deviated in one direction; and a signal which represents "positive" when the selected x-point is deviated in the opposite direction. From the thus obtained moment M(x), a center detector 8 detects a zero-cross point at which the moment M(x) transits from "negative" to "positive", and determines the x-point at that time as the center Xc of the mark pattern M with regard to one window Wi. At this time, the values of moments M(x) on the opposite sides of the zero-cross point and close thereto may be used to complement the above-described processing for determining the center Xc. By doing so, it becomes possible to determine the center with higher accuracy. A center detecting system denoted generally by a character B in FIG. 1 comprises the above-described components.

Figure 5:
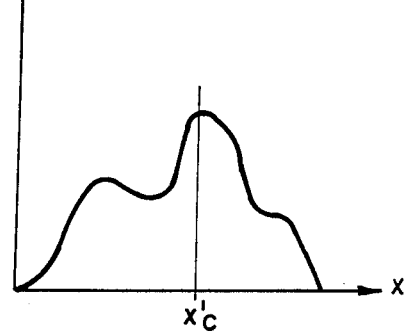
FIG. 5 is a graph exemplifying a histogram with regard to the center detected for each window.

The data concerning the center Xc having been detected by the center detecting system B, for each window Wi, is supplied to a center determining system C. Because of the inherent characteristics of the image data in each window (such as noise components that can-not be eliminated during the signal processing), the data concerning the center Xc obtained with regard to all the windows contains fluctuation or dispersion to some extent. The center determining system C includes a center determining circuit 9 which is operable first to prepare a histogram concerning the center Xc for each window Wi, such as illustrated in FIG. 5, and subsequently to determine the center Xc' of the mark pattern M on the basis of the peak value in the histogram and the center of gravity of the histogram curve in the neighborhood of the peak value.

Figure 6:
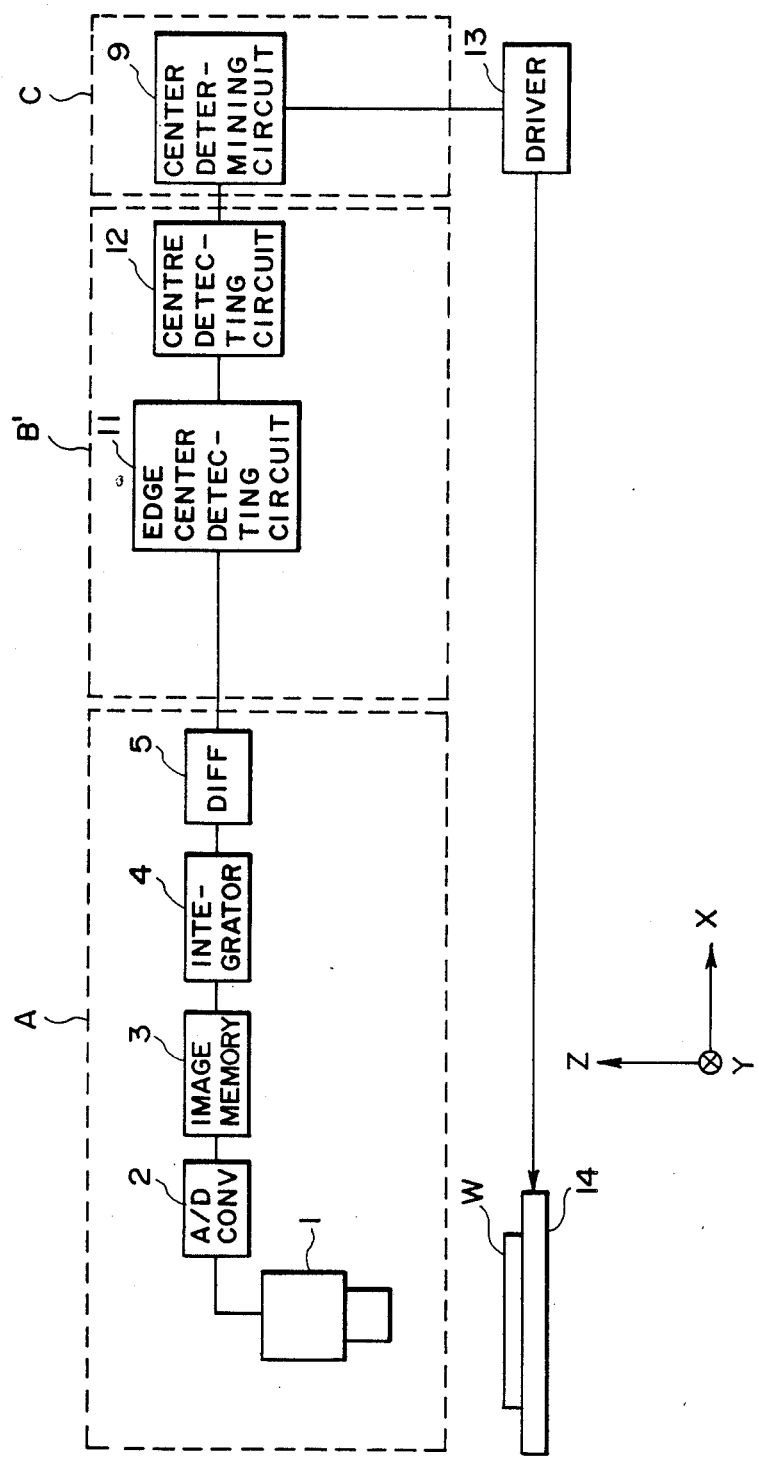
FIG. 6 is a view similar to FIG. 1 but showing a pattern detecting apparatus according to another embodiment of the present invention.

In the embodiment of the present invention as described hereinbefore, the width Po which is set with regard to the signal Lc(x) for detecting the moment M(x) becomes relatively large. In some cases, this leads to a possibility of insufficient precision of the pattern detection. If this occurs, the data concerning the center Xc' of the mark pattern M obtained in the FIG. 1 embodiment may be utilized and, by use of a pattern detecting method related to another embodiment of the present invention (which will be described with reference to FIG. 6), the center of the mark pattern can be determined with higher precision. Such pattern detecting method allowing higher-accuracy determination of the center of the mark pattern, will now be described in conjunction with the embodiment of the present invention as shown in FIG. 6. It should be noted that, in the following, the description will be made of a case where the data Xc' concerning the center as detected in the FIG. 1 embodiment is used. However, the data of the center which is usable is not limited to this.

Figure 7:
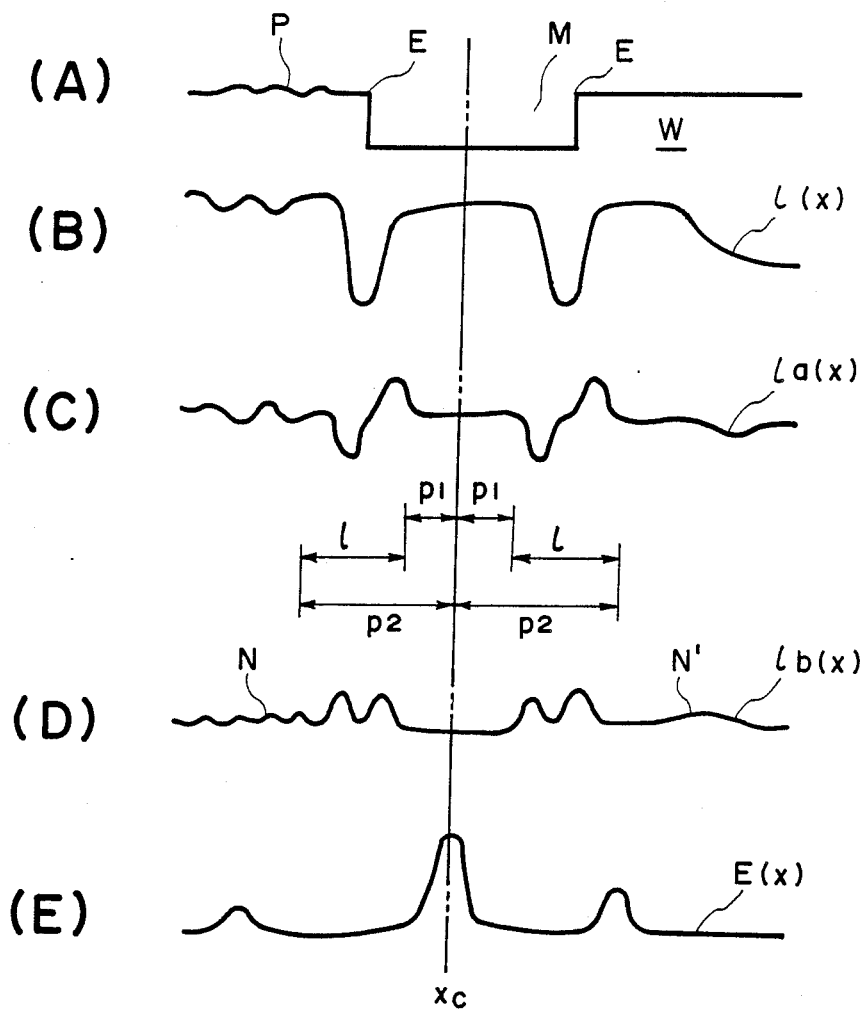
FIG. 7 is a waveform view showing various waveforms corresponding to a wafer mark pattern, having a sectional shape shown in a part (A) of FIG. 7, and obtainable at different portions of the FIG. 6 apparatus.

In the second embodiment shown in FIG. 6, a signal pre-processing system A produces data Lb(x) concerning an absolute differential, such as illustrated in part (D) of FIG. 7, which data is supplied to a center detecting system B'. This is the same as the case of the FIG. 1 embodiment. Here, the center detecting system B' includes an edge center detecting circuit 11 which functions to set a pair of ranges each $L(L=|P_2-P_2|)$, such as shown in part (C) of FIG. 7, in a symmetric manner with respect to each of given x-points (which points are within a region in the neighborhood of the center Xc' of the mark pattern as has been determined in the FIG. 1 embodiment). The limits $P_1$ and $P_2$ are so determined that the edges E of the mark pattern M are located within respective ranges L. The interval between the edges E of the mark pattern M is known or preset. Further, the point which can be regarded as the center of the mark pattern M has been determined by the FIG. 1 embodiment. Therefore, it is possible to set a comparatively narrow region for each range L. Also, the limits $P_1$ and $P_2$ can be determined easily. The edge center detecting circuit 11 operates to calculate an evaluation value E(x) for determining the "center" of the mark pattern M, in accordance with the following equation:

$$E(x) = \sum_{i=P_1}^{P_2} [\text{Min}\{Lb(x+i), Lb(x-i)\} \times B(x)] \quad (6)$$

wherein $$B(x) = 0, \text{ if } La(x+i) \times La(x-i) \geq 0; \text{ or}$$
$$= 1, \text{ if } La(x+i) \times La(x-i) < 0$$

This calculation is made on the basis of the presumption that the level of the absolute signal Lb(x) of the difference data becomes high in the neighborhood of each edge of the mark pattern M, such as illustrated in the part (D) of FIG. 7 and that, at such points that are symmetric with respect to the center of the mark pattern M, the difference data La(x) has opposite signs as illustrated in part (C) of FIG. 7. In equation (6), the term "Min{A,B}" denotes a smaller one of two real numbers A and B. As seen from a part (E) of FIG. 7, the evaluation value E(x) has a peak when the set x-point is coincident with the center Xc of the mark pattern M. Accordingly, a center detecting circuit 12 detects or determines, as the center Xc of the mark pattern M, such an x-point as defined at a moment at which the evaluation value E(x) reaches the peak. It should be noted that, in such case, the center of gravity of the evaluation value E(x) which is in the neighborhood of the x-point corresponding to the peak of the evaluation value E(x), may be determined as the center Xc of the mark pattern. Further, each range L set by the edge center detecting circuit 11 may preferably be made narrow in order to avoid adverse effects of a noise N due to the surface irregularity of the wafer W, a noise N' resulting from illuminance unevenness or otherwise, upon the evaluation value E(x).

In this manner, the center of the mark pattern is detected for each window Wi. Subsequently, a center determining circuit 9 finally determines the center Xc" of the mark pattern M on the basis of a histogram concerning the data of center Xc, in a similar manner as in the FIG. 1 embodiment. The function and operation of a center detecting system C including the center determining circuit 9 are essentially the same as those of the center detecting system of the FIG. 1 embodiment.

In each of the first and second embodiments shown in FIGS. 1 and 6, a driver 13 is provided to move a stage 14, holding the wafer W, on the basis of the data concerning the center of the mark pattern M and determined by the center determining circuit 9. In the case of the FIG. 6 embodiment, the driver 13 moves the stage 14 in accordance with an output from the center detecting circuit 11 thereby to align the wafer W with respect to a predetermined reference position.

In the embodiments described hereinbefore, a histogram is prepared in the center determining system C and by use of all the data concerning the center Xc and obtained with regard to all the windows Wi. However, the integrated data L(x) for each window may be evaluated by dispersion or otherwise, and the value concerning the center of the mark pattern and obtained in such window whose integrated data has low contrast or contains a large amount of noise component, may be prevented from being used in the preparation of the histogram. Namely, the data obtained only by effective windows may be selectively used to determine the center of the mark pattern. This permits further improvements of the accuracy and the reliability of the determination of the center of the mark pattern M.

In accordance with one aspect of the present invention, as has hitherto been described, a plurality of two-dimensional windows each having a desired or predetermined size are set with regard to a video signal obtained from a pattern by an image pickup means. In each window, the video signal is integrated, if necessary, in one direction with respect to a two-dimensional coordinate system, such that there are obtained plural integrated signals wherein the effects of a random noise or a spike noise contained in the video signal are attenuated. Thereafter, on the basis of the integrated signal in each window, the center of the pattern is calculated for each window. Then, on the basis of all the data concerning the center of the pattern and obtained with regard to all the windows, the center of the pattern is finally determined. This makes it possible to utilize statistical processing for the determination of the center of the pattern. As a result, the adverse effects of noise components or asymmetry contained in the video signal, the adverse effects of the distortion or dispersion of the video image with reference to a linear mark pattern as well as the adverse effects of errors related to the quantization of sampled outputs of the image pickup device, can be minimized as a whole. Therefore, the present invention assures high-accuracy determination of the center of a mark pattern.

Further, in accordance with another aspect of the present invention, a two-dimensional window having a desired or predetermined size is set with regard to a video signal obtained from a pattern by an image pickup means. In the window, the video signal is integrated in one direction with respect to a two-dimensional coordinate system. Further, a differential of the integrated signal between two points before and after each point (corresponding to each picture element) in the other direction with respect to the two-dimensional coordinate system, is calculated and, thereafter, any noise component is eliminated from such a differential signal. Subsequently, the moment at each point in the differential signal is calculated. Then, by detecting a zero-cross point of the moment among these points, the center of the pattern is determined. Accordingly, the center of the pattern can be determined very accurately.

Figure 8:
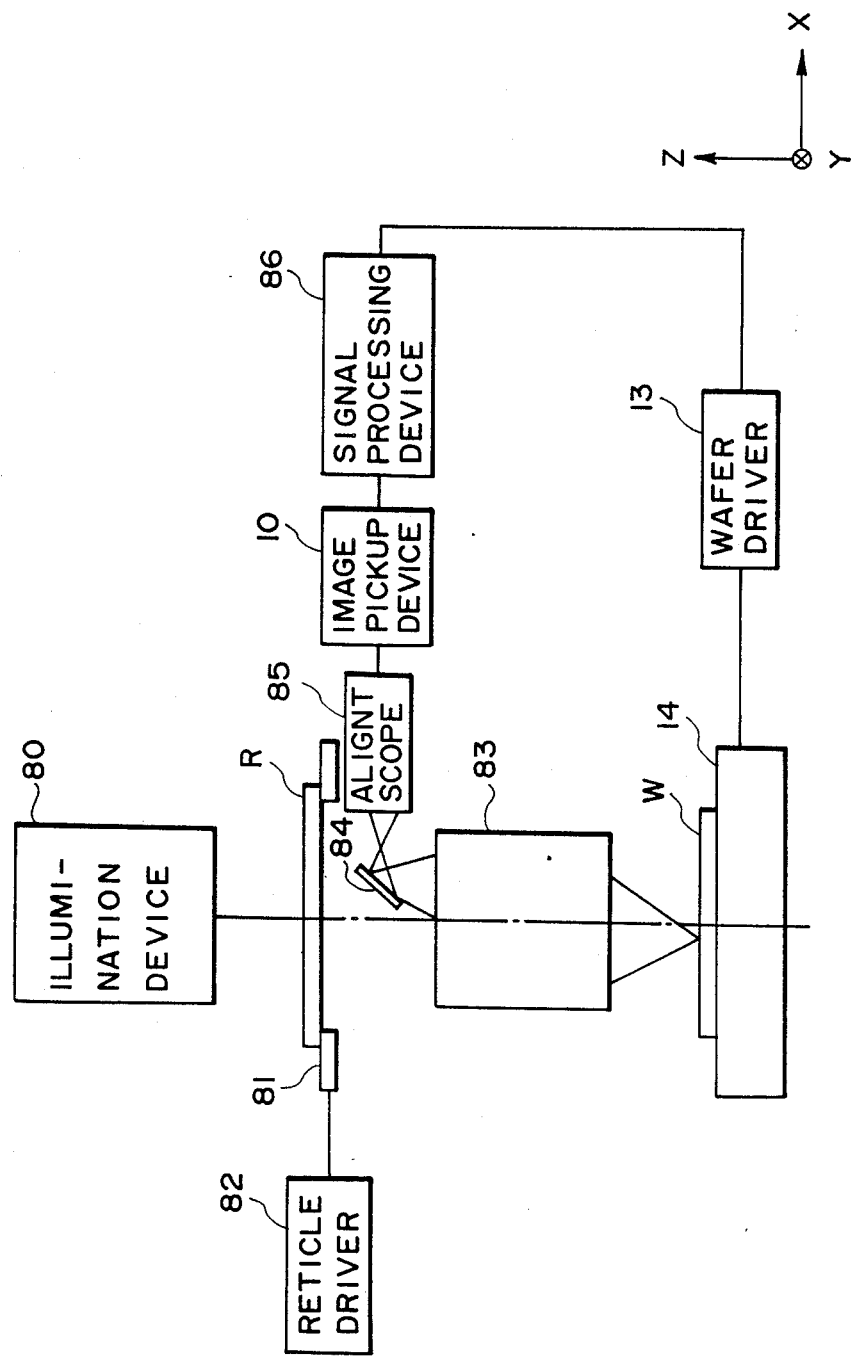
FIG. 8 is a schematic and diagrammatic view of an alignment and exposure system into which the present invention is incorporated.

Referring to FIG. 8, there is shown an alignment and exposure system into which the present invention is incorporated.

Denoted at R in FIG. is a reticle on which a circuit pattern is formed. Denoted W is a wafer on which the circuit pattern of the reticle R is going to be photoprinted. As shown, the system includes an image pickup device 10 which comprises a number of charge coupled devices or otherwise. An illumination device 80 is provided to illuminate the reticle R with a predetermined light. In this embodiment, the illumination device 80 includes an Hg lamp or an excimer laser. A reticle stage 81 supports the reticle R and is movable in each of the X and Y directions as illustrated. A reticle driver 82 is provided to move the reticle stage 81 to adjust the position thereof. A reduction projection optical system 83 is adapted to project, in a reduced scale, the circuit pattern of the reticle R upon the wafer W surface. The projection optical system 83 has been sufficiently aberration-corrected with respect to the wavelength of light used for the exposure. A wafer stage 14 supports the wafer W and is made movable translationally in the X, Y and Z directions as illustrated. Also, the wafer stage 14 is made rotationally movable about the Z axis. A wafer driver 13 is provided to drive the wafer stage 14.

The reticle R and the wafer W are provided with alignment marks, not shown usable for aligning the reticle R and the wafer W with respect to predetermined positions. Each alignment mark may be formed by linear mark patterns such as illustrated at M and M' in FIG. 3.

The position of the reticle R is detected by observing the alignment mark of the reticle R by use of a reticle alignment scope, not shown. On the basis of the result of detection, the reticle driving means 82 is actuated to displace the reticle stage 81, thereby to align the reticle R with respect to its reference position which is predetermined.

The alignment mark of the wafer W is illuminated by an alignment light having a wavelength which is different from that of the light used for the exposure (photoprinting). The light reflected from the wafer alignment mark and a neighboring portion thereof passes through the projection optical system 83 and is reflected by a mirror 84 toward a wafer alignment scope 85. After passing through the alignment scope 85, the light is projected upon the image pickup device 10. The image pickup device 10 has a light-receiving surface which is in an optically conjugate relation with the surface of the wafer W being illuminated. For this reason, an image of the wafer alignment mark is formed on the light-receiving surface of the image pickup device 10. The wafer alignment scope 85 has an optical system which is arranged to correct any chromatic aberration which is caused by the projection optical system 83 in relation to use of the alignment light for the observation of the wafer alignment mark.

The image pickup device 10 operates to photoelectrically convert, into electric signals, the image of the wafer alignment mark formed on its light-receiving surface. Whereby, video signals corresponding to the mark image are output from the image pickup device 10.

Denoted 86 in FIG. 8 is a signal processing unit which includes a signal pre-processing system, a center detecting system and a center determining system such as at A, B and C in FIG. 1 or, alternatively, such as at A, B' and C in FIG. 6. Thus, the video signals output from the image pickup device 10 are supplied into the signal processing unit 86 in which the position of the center of the image of the alignment mark is determined very accurately. The alignment system of FIG. 8 is provided with a predetermined wafer reference position which is usable as a reference for the alignment of the wafer. The wafer aligning reference position is in a predetermined positional relation with the reference position provided for the reticle R. Any positional deviation between the thus determined center of the image of the wafer alignment mark with respect to the wafer reference position, which is predetermined, is calculated by the signal processing unit 86, and an electric signal corresponding to the thus calculated positional deviation is supplied to the wafer driving means 13 for the wafer stage 14.

Responsive to the electric signal corresponding to the above-described positional deviation, the wafer driving means 13 operates to move the wafer stage 14 with high precision in the X direction and/or the Y direction. Further, if necessary, the driving means 13 moves the wafer stage 14 rotationally about the Z axis. By this operation, the wafer W is aligned with respect to its reference. In a case where each of shot areas defined on the wafer W surface is provided with an alignment mark, a particular shot area of the wafer is aligned with respect to the reference position by the above-described operation.

In the manner described hereinbefore, the reticle R and the wafer W (or a particular shot area of the wafer W) are aligned with respect to their reference positions, whereby the reticle R and the wafer W are aligned with each other very accurately. After completion of such reticle-to-wafer alignment, the mirror 84 and the wafer alignment scope 85 are retracted out of the path defined for the light from the illumination device 80. Thereafter, the reticle R is illuminated by the light supplied from the illumination device 80, with the result that the circuit pattern of the reticle R is transferred, in a reduced scale onto one of the shot areas on the wafer W.

In the alignment and exposure system of the present embodiment, the center of the alignment mark is detected in accordance with the pattern detecting method described with reference to the foregoing embodiments. Therefore, very accurate alignment is attainable. As a result, the circuit pattern of the reticle can be transferred onto each shot area on the wafer with higher precision.

While the invention has been described with reference to the structures disclosed herein, it is not confined to the details set forth and this application is intended to cover such modifications or changes as may come within the purposes of the improvements or the scope of the following claims.

What is claimed is:

1. A method of detecting the position of a pattern in a predetermined direction, said method comprising the steps of:
   forming an image of the pattern on an image pickup surface of an image pickup device;
   setting a plurality of different windows to the image pickup surface;
   processing image data in each window to detect, in each of the different windows, a center of the pattern with respect to the predetermined direction; and
   determining the position of the pattern in the predetermined direction, on the basis of results obtained by data processing made in relation to the different windows.

2. A method of detecting the position of a linearly extending pattern, with respect to a predetermined direction perpendicular to the lengthwise direction of the pattern, said method comprising the steps of:
   irradiating the pattern with a radiation beam;
   forming on an image pickup surface of an image pickup device an image of the pattern by using the beam irradiated from the pattern;
   setting a plurality of different windows to the image pickup surface;
   processing image data in each window to detect, in each of the different windows, a center of the pattern with respect to the predetermined direction; and
   determining the position of the pattern with respect to the predetermined direction, on the basis of results obtained by data processing made in relation to the different windows.

* * * * *

UNITED STATES PATENT AND TRADEMARK OFFICE
CERTIFICATE OF CORRECTION

PATENT NO. : 4,955,062

DATED : September 4, 1990

INVENTOR(S) : HIROSHI TERUI

It is certified that error appears in the above-identified patent and that said Letters Patent is hereby corrected as shown below:

COLUMN 4

Line 54, "$x_1 \leqq X \leqq x_2$" should read --$x_1 \leqq x \leqq x_2$--.
Line 57, "range "$x_1 \leqq X \leqq x_2$"" should read --range "$x_1 \leqq x \leqq x_2$"--.
Line 65, "$x_1 \leqq X \leqq x_2$" should read --$x_1 \leqq x \leqq x_2$--.
Line 68, "of" should read --or--.

Signed and Sealed this

Eleventh Day of August, 1992

Attest:

DOUGLAS B. COMER

*Attesting Officer*     *Acting Commissioner of Patents and Trademarks*